United States Patent
Kan et al.

(10) Patent No.: US 7,867,892 B2
(45) Date of Patent: Jan. 11, 2011

(54) PACKAGING CARRIER WITH HIGH HEAT DISSIPATION AND METHOD FOR MANUFACTURING THE SAME

(75) Inventors: Ming-Chi Kan, Rende Township, Tainan County (TW); Shih-Yao Huang, Liouguei Township, Kaohsiung County (TW); Shao-Chung Hu, Sindian (TW)

(73) Assignee: Kinik Company (TW)

( * ) Notice: Subject to any disclaimer, the term of this patent is extended or adjusted under 35 U.S.C. 154(b) by 322 days.

(21) Appl. No.: 12/071,307

(22) Filed: Feb. 20, 2008

(65) Prior Publication Data

US 2009/0085180 A1 Apr. 2, 2009

(30) Foreign Application Priority Data

Sep. 29, 2007 (TW) ............... 96136526 A

(51) Int. Cl.
*H01L 21/4763* (2006.01)
(52) U.S. Cl. ............... 438/637; 438/107; 438/115; 438/122; 438/455; 438/745
(58) Field of Classification Search ............ 438/74, 438/107, 109, 115, 122, 455, 647, 745
See application file for complete search history.

(56) References Cited

U.S. PATENT DOCUMENTS

| | | | | |
|---|---|---|---|---|
| 6,521,844 B1 * | 2/2003 | Fuerniss et al. | ............. | 174/258 |
| 6,670,269 B2 * | 12/2003 | Mashino | ............. | 438/637 |
| 6,713,792 B2 * | 3/2004 | van der Windt | ............. | 257/252 |
| 7,594,322 B2 * | 9/2009 | Farnworth et al. | ............. | 29/852 |
| 7,603,772 B2 * | 10/2009 | Farnworth et al. | ............. | 29/852 |
| 7,608,904 B2 * | 10/2009 | Sinha | ............. | 257/449 |
| 7,666,788 B2 * | 2/2010 | Sinha | ............. | 438/667 |
| 7,701,039 B2 * | 4/2010 | Kirby et al. | ............. | 257/621 |
| 2002/0038908 A1 * | 4/2002 | Ding et al. | ............. | 257/720 |
| 2003/0058630 A1 * | 3/2003 | Takano et al. | ............. | 361/783 |

* cited by examiner

*Primary Examiner*—Mary Wilczewski
*Assistant Examiner*—Telly D Green
(74) *Attorney, Agent, or Firm*—Bacon & Thomas, PLLC

(57) ABSTRACT

The present invention relates a packaging carrier with high heat dissipation for packaging a chip, comprising: a carrier body, an interfacial metal layer, at least one diamond-like carbon thin film, a plated layer, and an electrode layer. Herein, the packaging carrier further comprises through holes. The present invention further discloses a method for manufacturing the aforementioned packaging carrier, comprising: providing a carrier body; forming an interfacial metal layer on the upper surface of the carrier body; forming a diamond-like carbon thin film on the interfacial metal layer; forming a plated layer on the diamond-like carbon thin film; forming an electrode layer on the lower surface of the carrier body; and forming through holes extending through all or part of the aforementioned elements. The present invention uses a diamond-like carbon thin film and through holes for heat dissipation in three dimensions to improve heat dissipation of an electronic device.

13 Claims, 5 Drawing Sheets

(3a)

(3b)

(3c)

(3d)

(3e)

(3f)

PACKAGING CARRIER WITH HIGH HEAT DISSIPATION AND METHOD FOR MANUFACTURING THE SAME

BACKGROUND OF THE INVENTION

1. Field of the Invention

The present invention relates to a packaging carrier with high heat dissipation and, more particularly, to a packaging carrier with high heat dissipation using a diamond-like carbon thin film and pluralities of through holes, and a method for manufacturing a packaging carrier with high heat dissipation.

2. Description of Related Art

The commonly used chips, such as light emitting diode devices (LEDs), are widely applied in various electrical devices, such as backlight sources for display devices, mini-projectors and lighting, due to their high emitting brightness. However, in the current LEDs, about 80% of input power is converted to thermal energy. Thereby, if the heat cannot be suitably dissipated, the junction temperature of the LED chips will increase and further results in the decreasing of both the brightness and the lifetime of the device. In fact, in the past decades, many researchers paid lots of effort to improve the heat dissipation at the packaging stage. Among these aforementioned problems, to improve the problems of poor heat conductivity in a heat dissipation structure of a traditional heat dissipation substrate and a traditional insulating layer is most important.

As shown in FIG. 1, published Taiwan Patent 543921 discloses an electroluminescence display device using a cup-like structure 54 with a concave surface and heat dissipation holes 51 to present high efficiency of heat dissipation. However, a traditional insulating layer 52 is used, and thereby the efficiency of heat dissipation cannot be efficiently enhanced. Even though the heat dissipation holes are used, the efficiency of heat dissipation is still limited, and the heat dissipation in all directions cannot be realized.

U.S. Pat. No. 637,268B1 discloses a semiconductor device using a diamond-like carbon thin film and an etching via hole with implanted wiring. However, in U.S. Pat. No. 637,268B1, the via hole has a copper wiring therein for electric conduction, and a silicon substrate is used as a base layer. Thereby, the efficiency of heat dissipation in the via hole is impaired. In published Japanese Patent 2005292700, an electroluminescence display device using a diamond-like carbon thin film and a via hole is disclosed. However, the diamond-like carbon thin film is formed on the surface of the substrate, and thus the heat generated from the electronic component in the packaging carrier cannot be suitably dissipated.

Published Japanese Patent 2178979 discloses a light emitting layer of an electroluminescence display device, which has a through hole vertically passing the light emitting layer for heat dissipation. However, in published Japanese Patent 2178979, an insulating layer, but not a diamond-like carbon thin film as used in the present invention, is formed on the surface of the light emitting layer, and thereby the efficiency of heat dissipation is limited. In general, if a diamond-like carbon thin film is used instead of a conventional insulating layer, the surface temperature of the chip can be reduced about 15° C. for a circuit board of a light emitting diode. The present invention uses at least one diamond-like carbon thin film and pluralities of through holes for allowing the packaging carrier to exhibit the significant efficiency for heat dissipation in three dimensions. Published Japanese Patent 2003215163 discloses a probe card comprising a diamond-like carbon thin film and a via hole. The thermal non-uniformity in a semiconductor microstructure increases the contact points between the probe tip parts and the electrodes. Thereby, in published Japanese Patent 2003215163, the via hole is used for fixing the probe and ensuring the positional precision of the probe tip part so as to resolve the partial of the thermal non-uniformity in a guide plate, and the diamond-like carbon thin film is formed on the surface of a control board. However, published Japanese Patent 2003215163 still does not resolve the problem about the heat dissipation of a packaging carrier.

Therefore, it is desirable to provide a packaging carrier with high efficiency of heat dissipation and heat conductivity to mitigate the aforementioned problems of poor heat conductivity in a traditional heat dissipation structure of a heat dissipation substrate and a traditional insulating layer so as to improve the heat dissipation of an electronic device.

SUMMARY OF THE INVENTION

The object of the present invention is to provide a packaging carrier with high heat dissipation using a diamond-like carbon thin film and pluralities of through holes for heat dissipation in three dimensions to improve heat dissipation of an electronic device.

The present invention provides a packaging carrier with high heat dissipation for packaging a chip, comprising: a carrier body, comprising an upper surface and a lower surface; an interfacial metal layer, formed on the upper surface of the carrier body; a diamond-like carbon thin film, formed on the interfacial metal layer; a plated layer, formed on the surface of the diamond-like carbon thin film; and an electrode layer, formed on the lower surface of the carrier body, wherein the packaging carrier further comprises pluralities of through holes extending through the plated layer, the diamond-like carbon thin film, the interfacial metal layer, the carrier body, and the electrode layer.

The packaging carrier with high heat dissipation according to the present invention can further comprise a metal-filled structure formed of a metal deposited in the through holes. Herein, the material of the metal-filled structure is not limited. Preferably, the material of the metal-filled structure is copper or silver.

The packaging carrier with high heat dissipation according to the present invention can further comprise another diamond-like carbon thin film formed between the lower surface and the electrode layer.

In the packaging carrier with high heat dissipation according to the present invention, the diamond-like carbon thin film can have a thickness of 0.1 μm~100 μm. Preferably, the diamond-like carbon thin film has a thickness of 1 μm~10 μm.

In the packaging carrier with high heat dissipation according to the present invention, the pluralities of the through holes can have a diameter of about 1 μm~1000 μm, and the cross-section area of the through holes is not limited. Preferably, each of the through holes has 10~70 vol % based on the cross-section area of the packaging carrier. More preferably, each of the through holes has 20~40 vol % based on the cross-section area of the packaging carrier.

In the packaging carrier with high heat dissipation according to the present invention, the material of the carrier body can be silicon, FR4 resin, FR5 resin, bismaleimide triazine resin, copper, aluminum, or a ceramic material. The interfacial metal layer can be a metal foil layer formed of copper, silver, gold, or aluminum. The material of the plated layer can be silver, titanium, or chromium. Herein, the plated layer can be an electrode layer. The material of the electrode layer can be copper, silver, and gold.

In addition, the present invention provides a method for manufacturing a packaging carrier with high heat dissipation, comprising the following steps: (a) providing a carrier body, which comprises an upper surface and a lower surface; (b) forming an interfacial metal layer on the upper surface of the carrier body; (c) forming a diamond-like carbon thin film on the interfacial metal layer; (d) forming a plated layer on the diamond-like carbon thin film; (e) forming an electrode layer on the lower surface of the carrier body; and (f) forming pluralities of through holes extending through all or part of the elements formed by aforementioned steps (a) to (e). In the aforementioned steps, the performance of step (e) can selectively follow step (a), step (b), step (c) or step (d).

Besides, the method for manufacturing a packaging carrier with high heat dissipation according to the present invention can further comprise a step (e1) before step (e), forming another diamond-like carbon thin film on the lower surface of the carrier body, and the electrode layer is formed on the another diamond-like carbon thin film.

In the method for manufacturing a packaging carrier with high heat dissipation according to the present invention, the interfacial metal layer in step (b) is formed by bonding, lamination, or pasting on the upper surface of the carrier body; the diamond-like carbon thin film in step (c) is formed by plating or deposition; the plated layer in step (d) is formed by sputtering or electroplating; the electrode layer in step (e) is formed by plating; and the through holes in the step (f) are formed by chemical etching or machine-drilling. Herein, the performance of step (f) can selectively follow step (a), step (b), step (c) or step (d). That is, the pluralities of the through holes according to the present invention can thoroughly or partially extend into the packaging carrier.

The method for manufacturing a packaging carrier with high heat dissipation according to the present invention can further comprise a step (g) after step (f), forming a metal-filled structure in the through holes formed in step (f) so as to enhance the heat conductivity and exhibit electrical conductivity. Herein, the material of the metal-filling structure is not limited. Preferably, the material of the metal-filling structure is copper or silver.

In the method for manufacturing a packaging carrier with high heat dissipation according to the present invention, the material of the carrier body can be silicon, FR4 resin, FR5 resin, bismaleimide triazine resin, copper, aluminum or a ceramic material. The interfacial metal layer can be a metal foil layer formed of copper, silver, gold, or aluminum. The material of the plated layer can be silver, titanium, or chromium. Herein, the plated layer can be an electrode layer. The material of the electrode layer can be copper, silver, or gold.

Accordingly, the packaging carrier with high heat dissipation and the manufacturing method of the present invention provide a packaging carrier comprising at least one diamond-like carbon thin film and pluralities of through holes for efficient heat dissipation in three dimensions and improving the heat dissipation of an electronic device.

Other objects, advantages, and novel features of the invention will become more apparent from the following detailed description when taken in conjunction with the accompanying drawings.

Figure 5:
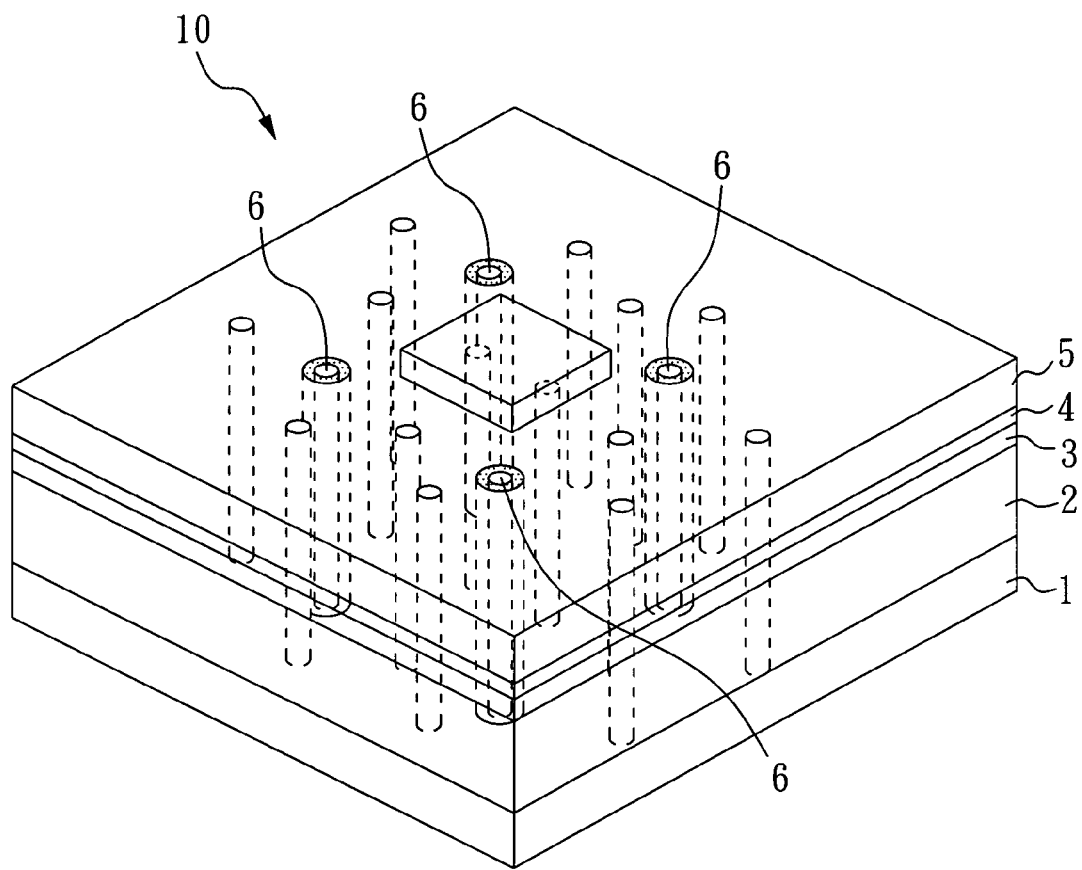

FIGS. (3a) to (3f) are cross-section views of a manufacturing method according to a preferable embodiment of the present invention;

FIGS. (4a) to (4f) are cross-section views of a manufacturing method according to another preferable embodiment of the present invention; and FIG. 5 is a three-dimensional view of a packaging carrier with high heat dissipation according to the present invention.

DETAILED DESCRIPTION OF THE PREFERRED EMBODIMENT

Figure 1:
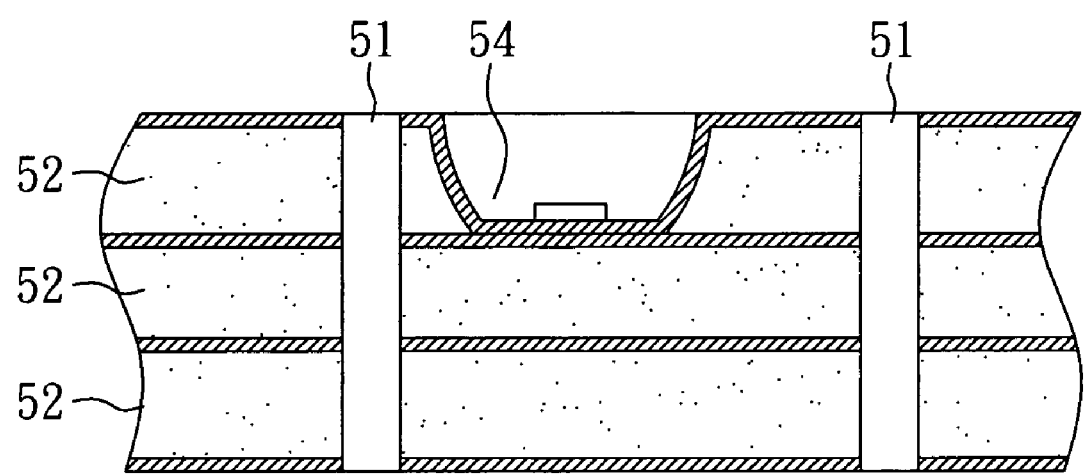
FIG. 1 is a cross-section view of a conventional packaging carrier with high heat dissipation.
Figure 2:
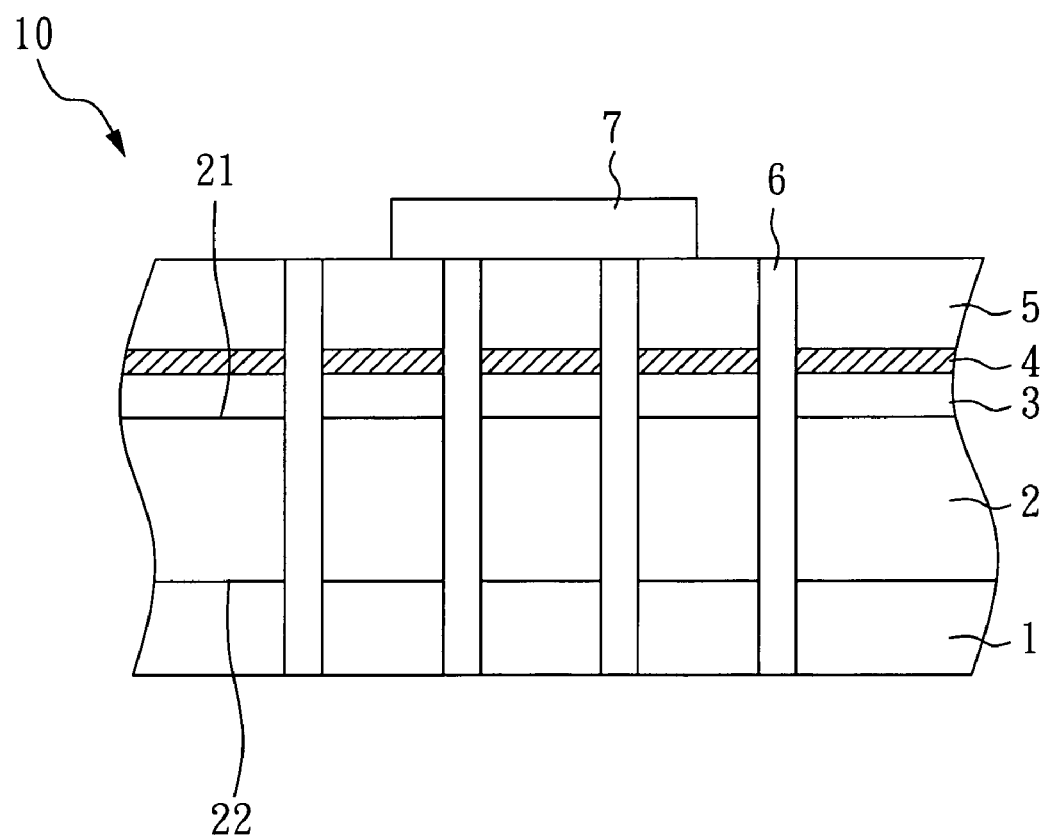
FIG. 2 is a cross-section view of a packaging carrier with high heat dissipation according to the present invention.
Figure 3:
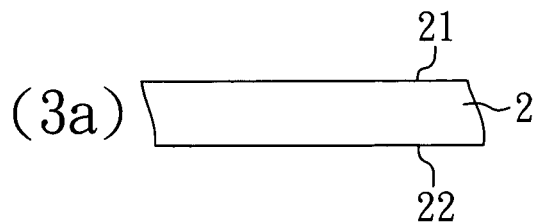
Figure 3:
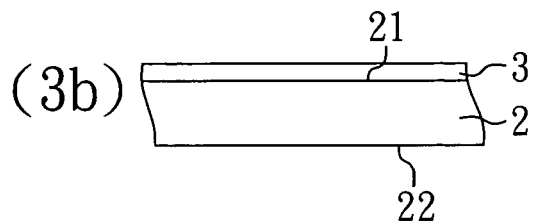
Figure 3:
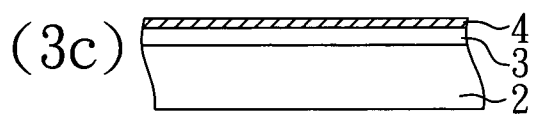
Figure 3:
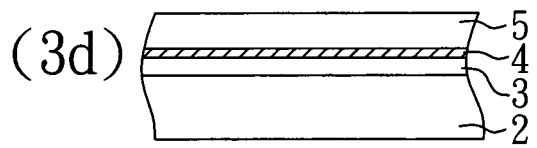
Figure 3:
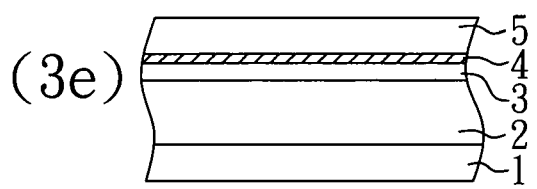
Figure 3:
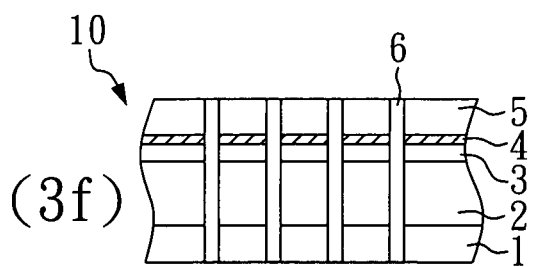
Figure 4:
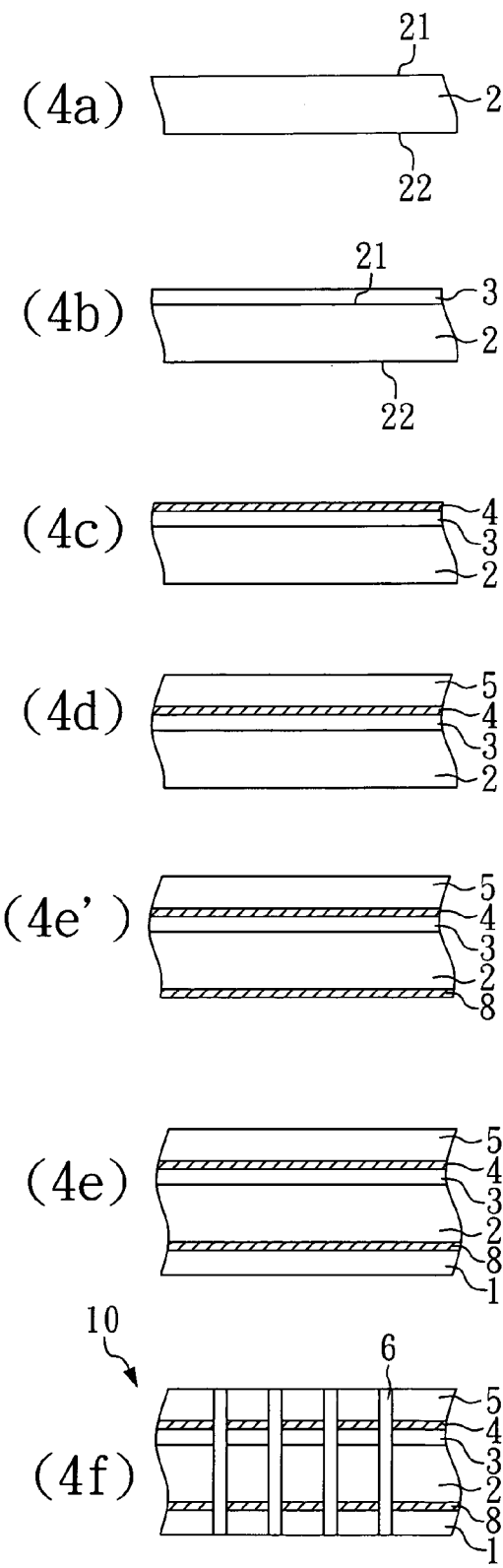

A packaging carrier 10 with high heat dissipation for packaging a chip 7 according to the present invention has a structure as shown in FIG. 2 and FIG. 5. FIG. 2 and FIG. 5 show a cross-section view and a three-dimensional top view of a packaging carrier with high heat dissipation according to the present invention, respectively. The packaging carrier 10 comprises: a carrier body 2 comprising an upper surface 21 and a lower surface 22; an interfacial metal layer 3 formed on the upper surface 21 of the carrier body 2; a diamond-like carbon thin film 4 formed on the interfacial metal layer 3; a plated layer 5 formed on the diamond-like carbon thin film 4, wherein the plated layer 5 can be an electrode layer; and an electrode layer 1 formed on the lower surface 22 of the carrier body 2, wherein the packaging carrier 10 further comprises pluralities of through holes 6 extending through the plated layer 5, the diamond-like carbon thin film 4, the interfacial metal layer 3, the carrier body 2 and the electrode layer 1.

Embodiment 1

With reference to FIGS. (3a) to (3f), there is shown a preferable embodiment of the present invention for manufacturing a packaging carrier 10 with high heat dissipation. The manufacturing method comprises the following steps (a) to (f).

(a) As shown in FIG. (3a), a carrier body 2 comprising an upper surface 21 and a lower surface 22 is first provided.

(b) As shown in FIG. (3b), an interfacial metal layer 3 is formed on the upper surface 21 of the carrier body 2 by bonding, lamination, or pasting.

(c) As shown in FIG. (3c), a diamond-like carbon thin film 4 with a thickness of 2 μm is plated or deposited on the interfacial metal layer 3.

(d) As shown in FIG. (3d), a plated layer 5 is formed on the diamond-like carbon thin film 4 by sputtering or electroplating.

(e) An electrode layer 1 is formed on the lower surface 22 of the carrier body 2 by plating, as shown in FIG. (3e).

(f) Pluralities of through holes 6 extending through the aforementioned elements formed in steps (a) to (e) are formed by chemical etching or machine-drilling, like the structure of the packaging carrier 10 with high heat dissipation as shown in FIG. (3f).

The manufacturing method can selectively include a step (g) after the step (f): a copper or silver metal-filling structure (not shown in the figures) is formed in the through holes formed in the step (f) so as to enhance heat conductivity and exhibit electrical conductivity.

In the present embodiment, the performance of step (e) can selectively follow step (a), step (b), step (c) or step (d) to accomplish the structure as FIG. (3f) in the present embodiment.

Embodiment 2

With reference to FIGS. (4a) to (4f), there is shown another preferable embodiment of the present invention for manufacturing a packaging carrier 10 with high heat dissipation. The manufacturing method comprises steps (a) to (f) as described in Embodiment 1, and further includes a step (e1) before step (e), as shown in FIG. (4e'): another diamond-like carbon thin film 8 is formed on the lower surface 22 of the carrier body 2 by plating. Then, the electrode layer 1 is formed on the diamond-like carbon thin film 8.

The manufacturing method can selectively include a step (g) after step (f): a copper or silver metal-filling structure (not shown in the figures) is formed in the through holes formed in the step (f) so as to enhance heat conductivity and exhibit electrical conductivity.

In the present embodiment, the performance of steps (e) and (e1) can selectively follow step (a), step (b), step (c) or step (d) to accomplish the structure as FIG. (4f) in the present embodiment.

Although the present invention has been explained in relation to its preferred embodiment, it is to be understood that many other possible modifications and variations can be made without departing from the scope of the invention as hereinafter claimed.

What is claimed is:

1. A method for manufacturing a packaging carrier with high heat dissipation, comprising:
   (a) providing a carrier body, which comprises an upper surface and a lower surface;
   (b) forming an interfacial metal layer on the upper surface of the carrier body;
   (c) forming a diamond-like carbon thin film on the interfacial metal layer;
   (d) forming a plated layer on the diamond-like carbon thin film;
   (e) forming an electrode layer on the lower surface of the carrier body; and
   (f) forming pluralities of through holes extending through the carrier body, the interfacial metal layer, the plated layer, the diamond-like carbon thin film, the electrode layer, or the combination thereof,
   wherein the performance of step (e) follows step (a), step (b), step (c) or step (d), and the performance of step (f) follows step (a), step (b), step (c) or step (d).

2. The method as claimed in claim 1, further comprising a step (e1) before step (e), forming another diamond-like carbon thin film on the lower surface of the carrier body, wherein the electrode layer is formed on the another diamond-like carbon thin film.

3. The method as claimed in claim 1, wherein in step (b), the interfacial metal layer is formed by bonding, lamination, or pasting.

4. The method as claimed in claim 1, wherein in step (c), the diamond-like carbon thin film is formed by plating or deposition.

5. The method as claimed in claim 1, wherein in step (d), the plated layer is formed by sputtering or electroplating.

6. The method as claimed in claim 1, wherein in step (e), the electrode layer is formed by plating.

7. The method as claimed in claim 1, wherein in step (f), the pluralities of the through holes are formed by chemical etching or machine-drilling.

8. The method as claimed in claim 1, further comprising a step (g) after step (f), forming a metal-filling structure in the through holes formed in step (f).

9. The method as claimed in claim 8, wherein the material of the metal-filling structure is copper or silver.

10. The method as claimed in claim 1, wherein the material of the carrier body is silicon, FR4 resin, FR5 resin, bismaleimide triazine resin, copper, aluminum, or a ceramic material.

11. The method as claimed in claim 1, wherein the interfacial metal layer is a metal foil layer formed of copper, silver, gold, or aluminum.

12. The method as claimed in claim 1, wherein the material of the plated layer is silver, titanium, or chromium.

13. The method as claimed in claim 1, wherein the material of the electrode layer is copper, silver, or gold.

* * * * *